United States Patent [19]

Hughes et al.

[11] 4,210,376

[45] Jul. 1, 1980

[54] ELECTRICAL CONNECTOR RECEPTACLE

[75] Inventors: Donald W. K. Hughes, Mechanicsburg; Ronald W. Myers, Landisburg, both of Pa.

[73] Assignee: AMP Incorporated, Harrisburg, Pa.

[21] Appl. No.: 14,442

[22] Filed: Feb. 23, 1979

Related U.S. Application Data

[63] Continuation-in-part of Ser. No. 967,441, Dec. 12, 1978.

[51] Int. Cl.[2] .......... H05K 1/12; H01R 23/10; H01R 23/56

[52] U.S. Cl. .......... 339/17 LC; 339/176 M

[58] Field of Search .......... 339/17 LC, 91 R, 126 R, 339/156 R, 176 M; 179/1 PC

[56] References Cited

U.S. PATENT DOCUMENTS

| | | | |
|---|---|---|---|
| 3,399,377 | 8/1968 | Warzecka | 339/176 MP |
| 3,850,497 | 11/1974 | Krumreich et al. | 339/126 R |
| 3,954,320 | 5/1976 | Hardesty | 339/99 R |
| 4,071,696 | 1/1978 | Anderson | 339/91 R |
| 4,088,384 | 5/1978 | Gumb | 339/156 R |

*Primary Examiner*—Neil Abrams
*Attorney, Agent, or Firm*—F. W. Raring

[57] ABSTRACT

Electrical connector receptacle of the type used in the telecommunications industry comprises a one-piece molded housing having a plug-receiving end and a plug-receiving opening extending into the plug-receiving end. A plurality of side-by-side conductors mounted in the housing have contact spring portions which extend from an internal sidewall of the plug-receiving opening adjacent to the plug-receiving end. These conductors extend over an external sidewall to the rearward end of the housing and across the rearward end past the other external sidewall, the ends of the conductors being intended to be inserted into holes in a circuit board and soldered to circuit board conductors. The housing has a frame portion which extends completely around the plug-receiving opening and has means at the rearward end for preventing insertion of a human finger into the plug-receiving end in a manner which could cause injury. A backwall is provided at the rearward end which prevents possible short circuiting of the conductors in the housing.

10 Claims, 13 Drawing Figures

Fig. 3
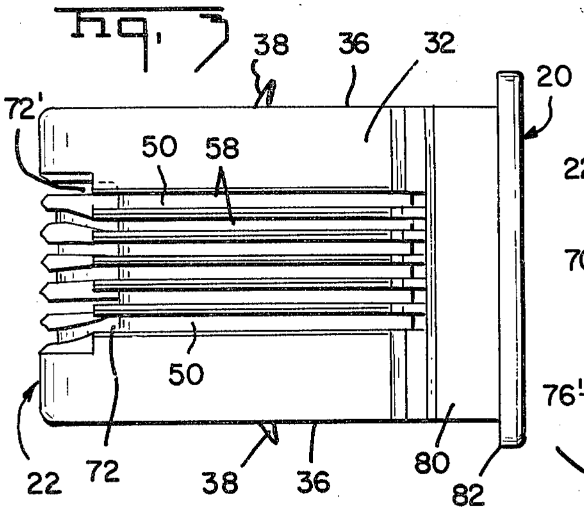
Fig. 2
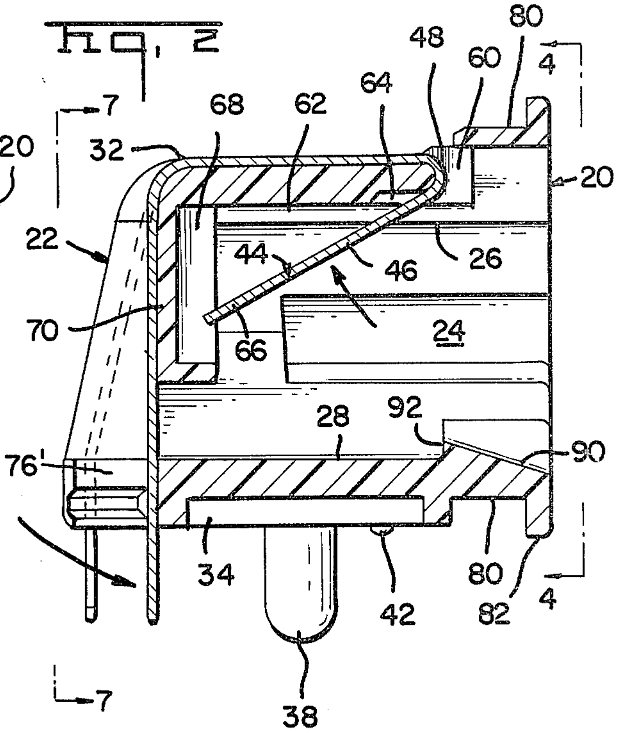
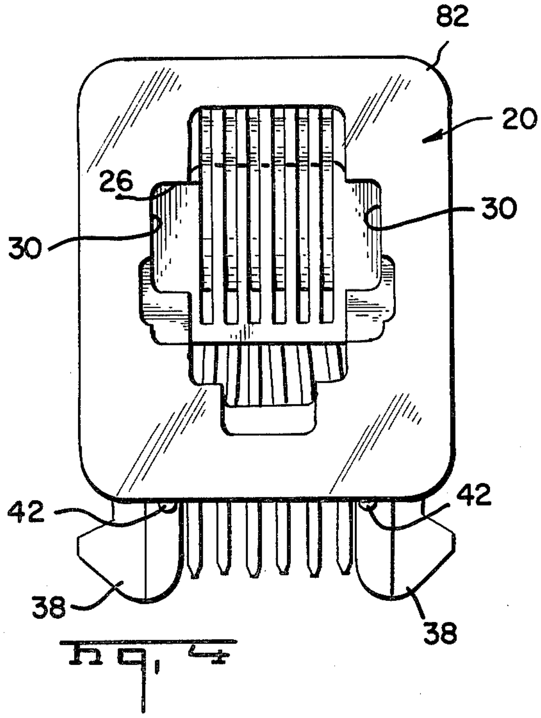
Fig. 4
Fig. 5
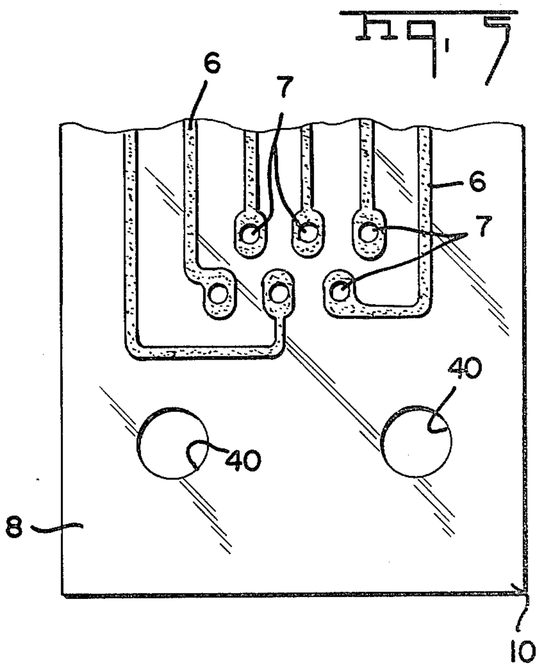

Fig. 7
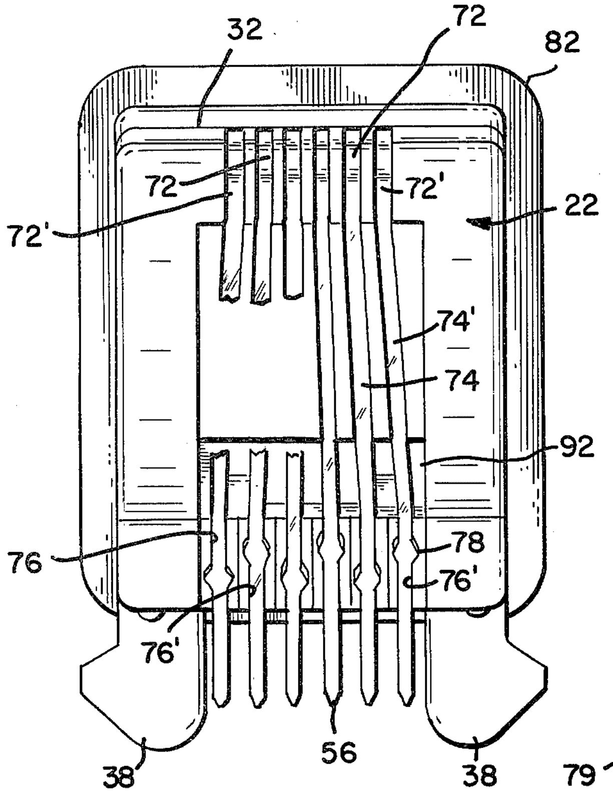
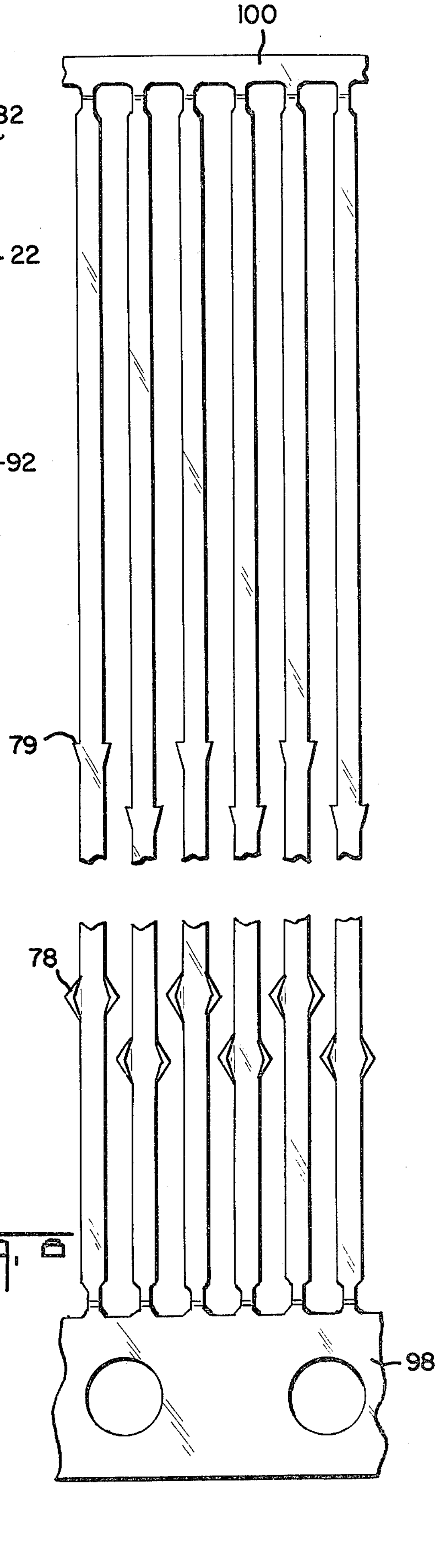
Fig. 8
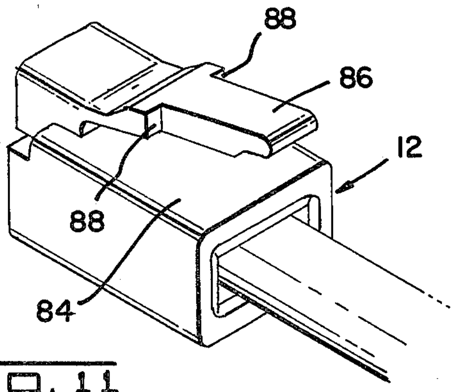
Fig. 11

ELECTRICAL CONNECTOR RECEPTACLE

This Application is a Continuation-in-part of Application Ser. No. 967,441, filed Dec. 12, 1978.

FIELD OF THE INVENTION

This invention relates to electrical connector receptacles, or jacks, as they are commonly called, of the type used in the telecommunications industry and described generally in the Federal Communications Commission documents published in the Federal Register on July 12, 1976, pages 28694–28782.

BACKGROUND OF THE INVENTION

The Federal Communications Commission documents referred to above set forth standards for electrical connector receptacles or jacks and mating connector plugs which are to be used in the telecommunications industry to achieve standardization of a wide variety of types of equipment used by the industry and used in conjunction with communications equipment. These documents set forth essential dimensions for the jacks and plugs but they leave room for innovation and improvement in the manufacture and performance of the plugs and jacks. A widely used type of jack or receptacle is described in detail in U.S. Pat. No. 3,850,497 and a commonly used type of connector plug is described in U.S. Pat. No. 3,954,320.

Application Ser. No. 940,536 filed Sept. 8, 1978, discloses and claims a connector receptacle which satisfies all of the requirements of the Federal Communications Commission documents and which differs from the receptacle shown in U.S. Pat. No. 3,850,497 in that it has one-piece conductors mounted in the housing which have end portions that extend beyond one of the external sidewalls of the housing and which can be inserted into holes in a circuit board and connected to conductors on the circuit board.

Application Ser. No. 967,441 filed Dec. 12, 1978, discloses and claims an improved version of the receptacle shown in the earlier application which permits mounting the receptacle on a circuit board in a manner such that the latching arm of the plug mated with the receptacle is not immediately accessible so that removal of the plug from the receptacle is discouraged. Connector receptacles as disclosed in Applications Ser. Nos. 940,536 and 967,441 are favorably viewed by the industry in that they can be mounted on a circuit board more conveniently than previously available jacks or receptacles and have other advantageous features. The present invention is directed to the achievement of further improvements relating to the elimination of a potential hazard in the receptacle, improved reliability, and improved means for mounting the receptacle in a panel. Specifically, the invention is directed to the achievement of a receptacle which does not present a hazard to an infant who might insert its finger into the plug-receiving opening of the receptacle. The invention further comprises a receptacle housing which will prevent possible shorting of the conductors of the receptacle if an improperly dimensioned plug member is inserted into the receptacle.

A connector receptacle in accordance with the invention comprises a one-piece housing of insulating material having a mating end and a plug-receiving opening extending into the mating end substantially to the rearward end of the housing. The plug-receiving opening has a continuous frame section therearound and a flange extending from this frame section which cooperates with a panel member when the receptacle is mounted on electronic equipment having panels surrounding the circuit boards. The conductors have spring portions which extend from one of the internal sidewalls of the plug-receiving opening diagonally towards the rearward end of this opening. These conductors extend through apertures in the housing which are spaced from the frame at the plug-receiving end. The conductors extend from these apertures across an external sidewall of the housing and then over the rearward end of the housing and beyond the other external sidewall. Barriers are provided in the plug-receiving opening at the rearward end thereof which define stalls that surround the ends of the contact springs and these barriers overcome a hazard of previous receptacles in that they render it impossible for a small child to insert its finger into the plug-receiving opening and injure itself on the ends of the contact springs. The barriers and an integral backwall prevent shorting of adjacent conductors in the event of abusive use or carelessness and misuse.

DESCRIPTION OF THE DRAWING

FIG. 2 is a cross-sectional view taken along the lines 2—2 of FIG. 1 but omitting the circuit board.

FIGS. 3 and 4 show a top plan and frontal view respectively of the connector receptacle.

FIG. 5 is a plan view of the underside of a circuit board showing the conductors thereon and the pattern for the holes which receive the conductors of the receptacle.

FIG. 7 is a view of the rearward end of the receptacle.

FIG. 8 is a plan view of a section of a strip of conductors.

FIG. 11 is a view of a connector plug showing the latching arm.

PRACTICE OF THE INVENTION

Figure 1:
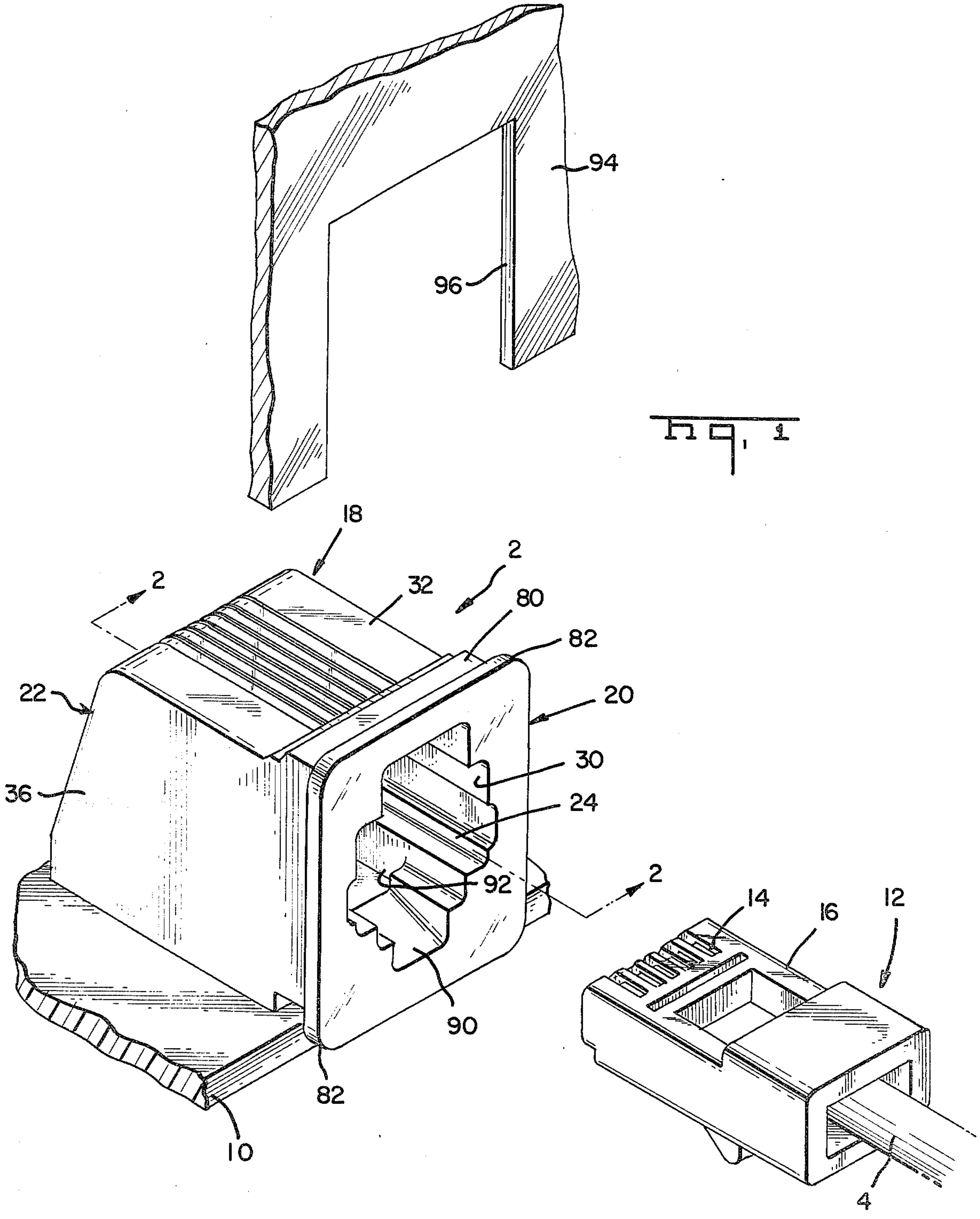
FIG. 1 is a perspective view of a connector receptacle in accordance with the invention mounted on a circuit board and showing a portion of a panel and a connector plug exploded from the receptacle.

Referring first to FIGS. 1-5, an electrical connector receptacle or jack 2, in accordance with the invention, serves to connect conductors in a cable 4 to conductors 6 on the underside 8 of a circuit board 10. The conductors 6 extend to holes 7 in the circuit board which receive the end portions of conductors in the receptacle 2 so that the connector conductors can be soldered to the circuit board conductors 6. The cable 4 has a standard plug 12 on its end and the conductors in the cable are in electrical contact with contact members 14 which extend to the upper surface 16 of the plug. When the plug is inserted into the receptacle, the exposed contacts 14 are engaged with contact springs in the receptacle 2 as will be described below.

The receptacle 2 comprises a one-piece molded housing 18 of suitable plastic material, such as a filled nylon, having a plug-receiving end 20, a rearward end 22, and having a plug-receiving opening 24 extending into the plug-receiving end 20. The opening 24 has upper and lower (as viewed in the drawing) internal sidewalls 26, 28 and opposed endwalls 30. The housing has upper and lower external sidewalls 32, 34 which are proximate to the internal sidewalls 26, 28 respectively and oppositely directed external endwalls 36. Mounting feet 38 extend from the lower external sidewall 34 and are dimensioned to enter spaced apart holes 40 in the circuit board 10 and stand-off bosses 42 are provided on the sidewall 34 to elevate this sidewall above the upper surface of the circuit board when the housing is mounted thereon.

Figure 6:
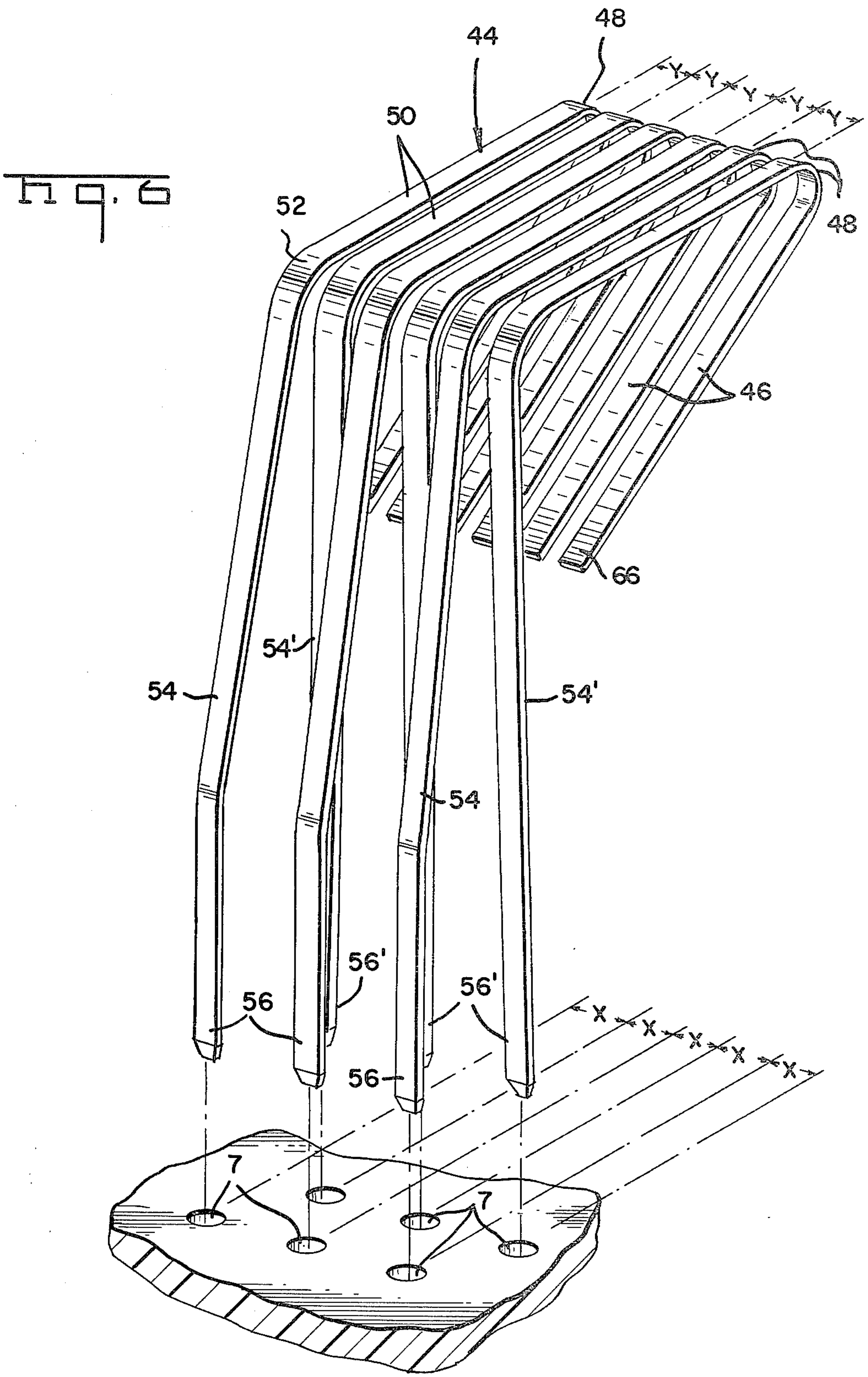
FIG. 6 is a perspective view of the conductors of the receptacle as viewed from the rearward ends thereof and illustrating the manner in which the conductors are spread apart at the ends which are received in the circuit board holes. This view does not show the retaining lances on the conductors in the interest of simplicity.

A plurality of side-by-side stamped and formed conductors generally indicated at 44 are contained in, and on, the housing. As best shown in FIG. 6, each conductor has a contact spring portion 46 having a free end 66, a reverse bend 48, an intermediate lead section 50 which extends, as viewed in FIG. 6, rearwardly from the reverse bend, an additional bend 52, and downwardly extending lead portions 54, 54'. The lower ends 56, 56' of the portions 54', 54 are intended for insertion into the holes 7 of the circuit board and are offset from each other so that they can be received in circuit board holes which are arranged in a triangular pattern.

The portions 50 of the conductors are disposed in parallel side-by-side channels 58 in the upper external sidewall 32. These channels extend from the rearward end of the housing to spaced-apart apertures 60 which are adjacent to, but spaced from the plug-receiving end 20. These apertures are completely enclosed and the bent portions 48 of the conductors extend through these apertures and around conforming surfaces of the housing, as shown in FIG. 2. The internal sidewall 26 has spaced-apart recesses 62 which are dimensioned to receive the contact spring portions 46 of the conductors when the plug is inserted. Upon insertion of the plug the springs 46 are flexed upwardly and resiliently engage the exposed contact members 14 of the plug. The recesses 62 are enlarged adjacent to the aperture 60, as shown at 64, to permit this flexure.

A plurality of parallel spaced-apart barriers 68 extend downwardly into opening 24 from the upper sidewall 26 adjacent to the rearward end 22 and these barriers define stalls which receive the free ends 66 of the contact springs 46. Additionally, a backwall 70 extends across the plug-receiving opening and downwardly, as indicated in FIG. 2, partially enclosing the plug-receiving opening at the rearward end. The barrier walls 68 correct a pre-existing hazard of receptacles of the type described in the FCC documents in that it was discovered that in the absence of some protective means, it was possible for a small child to insert its finger into the plug-receiving opening of the receptacle to a point beyond the ends 66 of the contact springs so that when the finger was withdrawn it tended to become impaled on the ends of the springs. As will be apparent from FIG. 2, it would be impossible to insert a finger beyond the ends 66 of the contact springs 46 of the disclosed embodiment. The back wall strengthens the barrier walls 68 although it is not essential to removal of the hazardous condition. This back wall 70 does prevent the possibility of shorting between conductors as described below.

As shown in FIGS. 3 and 7, channels 72, 72' are provided in the outwardly sloping rearward end of the housing adjacent to the external sidewall 32 and additional conductor-receiving channels 76, 76' are provided in the rearward end adjacent to the lower external sidewall 34. The channels 76' are relatively deep while the channels 76 are comparatively shallow.

The conductors extend from the upper external sidewall 32 into the channels 72, 72' and downwardly beyond the lower external sidewall 38. The downwardly extending portions of the conductors are spread apart in two senses; the center-to-center spacing between the conductors (x in FIG. 6) is increased and additionally the conductors 56 are offset from the conductors 56' so that the ends 56 and 56' will be received in holes 7 arranged on a triangular pattern. The deep channels 76' receive the conductors 56' and these conductors extend across the rearward surface of the wall 70 while the conductors 54 extend outwardly from this wall to the relatively shallow channels 76. Retaining lances 78 (FIG. 8) are provided on the conductors adjacent to their lower ends 56, 56' and these lances are received in recesses in the sidewalls of the channels 76, 76' to retain the conductors in the channels.

The FCC documents referred to above specify that the center-to-center spacing of the contact spring members in the receptacle be 0.04" (the y spacing of FIG. 6). This spacing is relatively close for circuit board holes such as the holes shown at 7 and conductors in a circuit board on centers this close may give rise to dielectric problems. The provision of the channels 76, 76' on centers x, which is greater than the y spacing, overcomes this problem and improved dielectric characteristics are achieved when the receptacle is put to use. As previously mentioned, the back wall 70 prevents possible shorting between the conductors in that the ends 66 are separated by an insulating wall from the portions 54 and 54' of the conductors. In the absence of the wall 70, it is possible that insertion of an improperly dimensioned plug or other abusive treatment of the receptacle might cause the end 66 of one conductor to be pushed against the intermediate portion 54 or 54' of adjacent conductor. This cannot happen with a receptacle in accordance with the invention.

The plug-receiving end of the housing has a continuous frame 80 which totally surrounds the plug-receiving opening 24. A flange 82 extends from this frame in all directions so that when the receptacle is mounted as shown in FIG. 1, on a circuit board with the intention that a panel 94 be located adjacent to the edge of the circuit board, an opening 96 can be provided in the panel dimensioned such that the frame portion 80 is received in the opening. The flange 82 will then extend beyond the edges of opening 96 and present a pleasing and neat appearance from the outside of the panel. This arrangement thus facilitates manufacture of equipment using standard modular receptacles.

The plug 12 has a latch arm 86 extending rearwardly from its side 84 and shoulders 88 are provided on this latch arm for latching the plug to the receptacle. The plug-receiving opening has an upwardly inclined ramp 90 at its mating end which extends to spaced-apart shoulders 92 which cooperate with the shoulders 88 on the plug to retain the plug in the receptacle.

Figure 9:
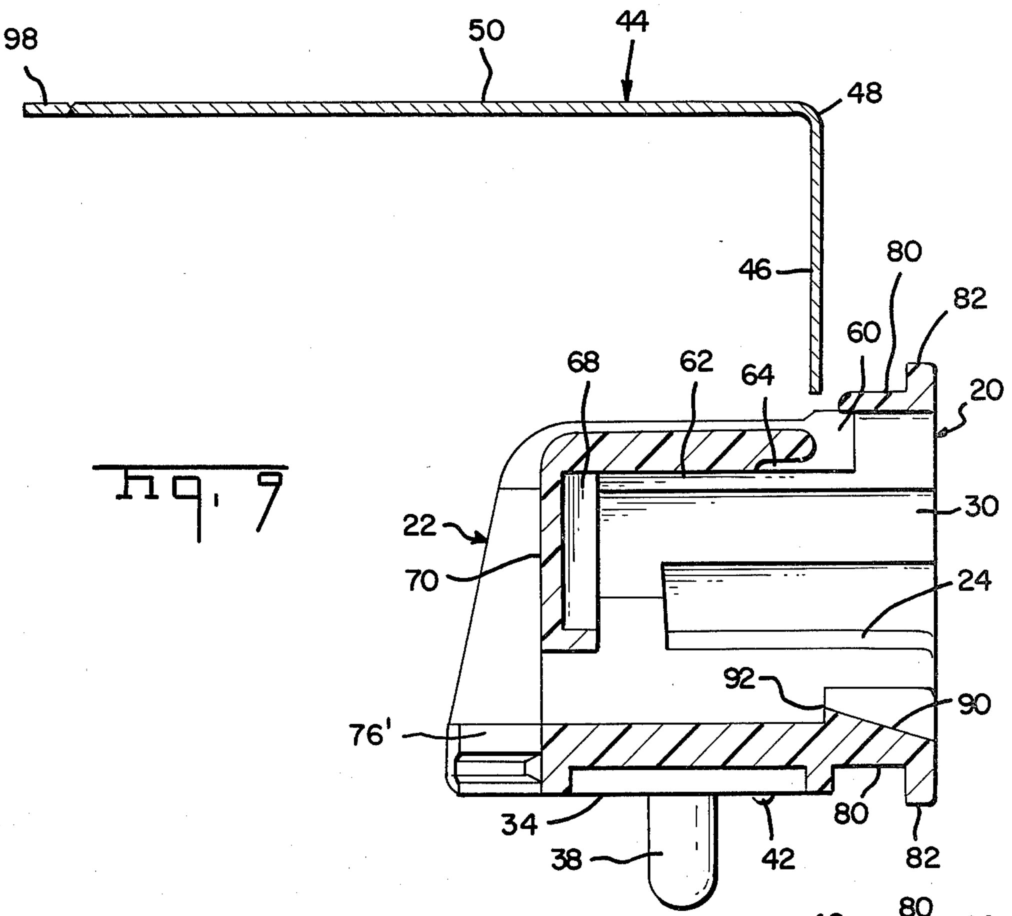
FIGS. 9 and 10 are cross-sectional views of the receptacle housing illustra ting the assembly of the conductors to the housing.
Figure 10:
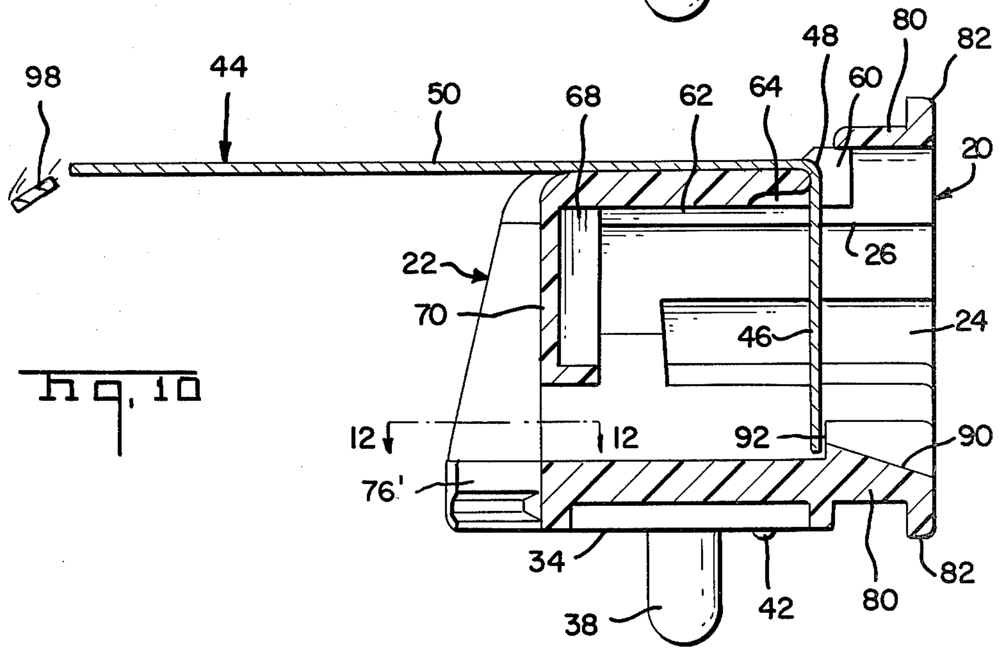
Figure 12:
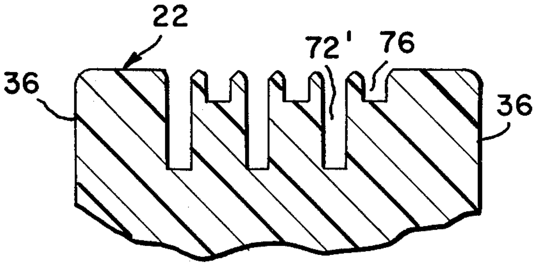
FIG. 12 is a view taken along the lines 12—12 of FIG. 10.

In the manufacture of the receptacle, the conductors are produced as a continuous strip, as shown in FIG. 8, by stamping the strip and forming it as shown. The retention lances 78 are offset from each other because of the close spacing of the conductors in the housing and the additional barbs 79 are provided to secure the portions 50 of the conductors in the channels 58. The strip has a relatively wide carrier strip 98 on its side adjacent to the lances 78 and a more narrow carrier strip 100 on its other edge. The conductors are assembled to the housings, as shown in FIGS. 9 and 10, by first removing the carrier strip 100 from a section of the strip, forming a right angle bend 48, and positioning the section of strip above a housing, as shown in FIG. 9, with the conductors in alignment with the apertures 60. The section of strip is then moved downwardly to the position of FIG. 10 so that the portions 50 of the conductors are in the channels 58. At this stage, the ends of the conductors will be adjacent to the shoulders 92 and it should be noted that the opening must be dimensioned such that there is sufficient clearance at the sidewall 28 for these conductors. The spring portions of the conductors can then be bent inwardly by insertion of a suitable gage. The portions of the conductors which extend to the left in FIG. 10 are moved downwardly and are moved laterally by varying amounts to position them in the channels 72, 72', and 76, 76' in the rearward end of the housing. The carrier strip 98 must be removed before this final stage is carried out.

As explained above, the disclosed embodiment avoids the hazards of injury by insertion of a finger into the plug-receiving opening and avoids the possibility of shorting of conductors by careless misuse or intentional abuse. An additional advantage is that the apertures 60 are spaced from the plug-receiving end of the housing by a distance which is greater than that of known receptacles and relatively speaking, the contact spring portions of the conductors are shorter, other things being equal, than the contact spring portions of previously known receptacles. These shortened contact springs produce stiffer springs which means that a thinner gage material for the conductors can be used without sacrifice of contact force.

A further advantageous feature of the invention is that, notwithstanding the fact that the ends 56 of the conductors are offset from the ends 56', the conductors themselves can all be of the same length as shown in FIG. 8. In previous embodiments of connector plugs, offset conductors were achieved by providing conductors in two different lengths. In the present embodiment, the slope of the portions 54 of the conductors is relatively gentle and while the lower ends of these conductors will not be located in the same plains as the lower ends of the conductors 56' (the conductors 56 will be slightly above the ends of the conductors 56'), the difference is very slight and the ends of all of the conductors 56 and 56' will extend below the lower surface of the circuit board 10 so that they can soldered to the conductors 6.

Figure 13:
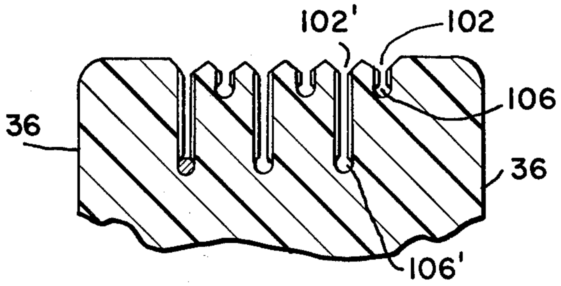
FIG. 13 is a view similar to FIG. 12, but showing details of an alternative embodiment of the invention.

Under some circumstances, it may be preferred to use drawn wire conductors rather than the stamped conductors shown in the drawing. Drawn wires can be used by providing alternately deep and shallow channels of the type shown at 102, 102' in FIG. 13. These channels have extremely narrow entrance portions and enlarged inner ends 106, 106'. The inner ends should be dimensioned to accommodate the wire conductors and the narrow entrance portions should have a width such that the conductors must be forced into the channels. The channels in the top wall 32 of the housing can be as shown in the previous figures if wire conductors are used, although these channels and the shape of the apertures 60, may be modified as desired.

We claim:

1. An electrical connector receptacle of the type comprising an insulating housing having a plug-receiving end and a rearward end, a plug-receiving opening extending into said plug-receiving end, said opening having opposed internal sidewalls and opposed internal endwalls, said housing having oppositely directed external sidewalls and oppositely directed external endwalls, a plurality of electrical conductors in side-by-side spaced-apart relationship, each of said conductors comprising a contact spring extending from one of said internal sidewalls at a location adjacent to said plug-receiving end diagonally into said opening and towards the opposite internal sidewall, and each conductor having a lead portion extending from said plug-receiving end through said housing between said one internal sidewall and the adjacent external sidewall and towards said rearward end, said plug-receiving opening being dimensioned to receive a connector plug having spaced-apart contact members therein which engage said contact spring portions of said conductors, said connector receptacle being characterized in that:

said plug-receiving end has a circumferentially continuous frame portion which surrounds plug-receiving opening, conductor-receiving aperture means extending through said adjacent sidewall to said one internal sidewall, said conductor-receiving aperture means being spaced from said plug-receiving end and adjacent to said frame portion, said conductor-receiving aperture means communicating with said plug-receiving opening, said conductors extending through said conductor-receiving aperture means, said contact springs extending into said plug-receiving opening from said conductor-receiving aperture means, a plurality of side-by-side channels in said adjacent external sidewall extending from said conductor-receiving aperture means to said rearward end, said lead portions of said conductors extending across said adjacent external sidewall and being in said channels, said conductors extending from said adjacent external sidewall across said rearward end and having end portions which extend beyond the other one of said external sidewalls, every other one of said conductors extending substantially normally from said adjacent external sidewall across said rearward end, the remaining conductors extending obliquely away from said adjacent external sidewall and across said rearward end whereby said end portions of said conductors are offset from each other.

2. An electrical connector receptacle as set forth in claim 1, said conductor-receiving aperture means comprising a plurality of side-by-side conductor-receiving apertures, each of said conductors extending through one of said conductor-receiving apertures.

3. An electrical connector receptacle as set forth in claim 1, each of said conductors comprising a stamped and formed strip of conductive metal.

4. An electrical connector receptacle as set forth in claim 1 having a plurality of spaced-apart barrier walls extending from said one internal sidewall at a location adjacent to said rearward end towards said opposite internal sidewall, said contact springs having free end portions, the free end portion of each contact spring being between an adjacent pair of said barrier walls.

5. An electrical connector receptacle as set forth in claim 1, each of said conductors comprising a solid wire.

6. A molded one-piece electrical receptacle of the type comprising an insulating housing having a plug-receiving end and a rearward end, a plug-receiving opening extending into said plug-receiving end, said opening having opposed internal sidewalls and opposed internal endwalls, said housing having oppositely directed external sidewalls and oppositely directed external endwalls, a plurality of electrical conductors in side-by-side spaced apart relationship, each of said conductors comprising a contact spring extending from one of said internal sidewalls at a location adjacent to said plug-receiving end diagonally into said opening and towards the opposite internal sidewall, and each conductor having a lead portion extending from said plug-receiving end through said housing between said one internal sidewall and the adjacent external sidewall and towards said rearward end, said plug-receiving opening being dimensioned to receive a connector plug having spaced-apart contact members therein which engage said contact spring portions of said conductors, said connector receptacle being characterized in that:

said plug-receiving end has a circumferentially continuous frame portion which surrounds said plug-receiving opening, a plurality of side-by-side conductor-receiving apertures extending through said adjacent external sidewall to said one internal sidewall, said apertures being spaced from said plug-receiving end and being adjacent to said frame portion, said conductors extending through said conductor-receiving apertures, said contact springs extending into said plug-receiving opening from said conductor-receiving apertures, a plurality of side-by-side channels in said adjacent external sidewall extending from said conductor-receiving apertures to said rearward end, and a like plurality of side-by-side channels in said rearward end extending from said adjacent external sidewall towards the other one of said external sidewalls, said lead portions of said conductors being disposed in said channels in said adjacent external sidewall and in said channels in said rearward end, said conductors having end portions which extend beyond the other one of said external sidewalls, every other one of said conductors having a substantially 90 degree bend at said rearward end and extending across said rearward end normally with respect to said adjacent external sidewall, and the remaining conductors being bent through an angle of less than 90° at said rearward end and extending across said rearward end obliquely with respect to said adjacent external sidewall whereby said end portions of alternate conductors are offset from the remaining conductors.

7. An electrical connector receptacle as set forth in claim 6, each of said conductors comprising a stamped and formed strip of conductive sheet metal.

8. An electrical connector receptacle as set forth in claim 7, having a plurality of spaced-apart barrier walls extending from said one internal sidewall at a location adjacent to said rearward end towards said opposite internal sidewall, said contact springs having free end portions which are between adjacent pairs of said barrier walls.

9. An electrical connector housing as set forth in claim 8, said receptacle having a backwall at said rearward end extending from said one internal sidewall towards said opposite internal sidewall, said barrier walls being integral with said backwall.

10. An electrical connector receptacle as set forth in claim 6, each of said conductors comprising a solid wire.

* * * * *

REEXAMINATION CERTIFICATE (183rd)

United States Patent [19]

Hughes et al.

[11] B1 4,210,376

[45] Certificate Issued Mar. 27, 1984

[54] ELECTRICAL CONNECTOR RECEPTACLE

[75] Inventors: Donald W. K. Hughes, Mechanicsburg; Ronald W. Myers, Landisburg, both of Pa.

[73] Assignee: Amp Incorporated, Harrisburg, Pa.

Reexamination Request:
No. 90/000,100, Nov. 4, 1981

Reexamination Certificate for:

| | |
|---|---|
| Patent No.: | **4,210,376** |
| Issued: | **Jul. 1, 1980** |
| Appl. No.: | **14,442** |
| Filed: | **Feb. 23, 1979** |

Related U.S. Application Data

[63] Continuation-in-part of Ser. No. 967,441, Dec. 12, 1978.

[51] Int. Cl.$^3$ .................... H01R 23/72; H01R 23/10; H01R 23/56

[52] U.S. Cl. .......................... 339/17 LC; 339/176 M

[58] Field of Search ............ 339/17 D, 17 C, 17 LC, 339/17 CF, 176 MP; 174/52 FP; 361/401, 404, 405, 408, 409, 421

[56] References Cited

U.S. PATENT DOCUMENTS

| | | | |
|---|---|---|---|
| 3,399,377 | 8/1968 | Warzecka | 339/176 |
| 3,579,176 | 3/1971 | Bokor et al. | 339/176 MP |
| 3,638,033 | 1/1972 | Johnson et al. | 339/17 LM |
| 3,693,131 | 9/1972 | Klehm, Jr. | 339/17 CF |
| 3,850,497 | 11/1974 | Krumreich et al. | 339/126 R |
| 4,025,147 | 5/1977 | Van Arsdale et al. | 339/176 MP |
| 4,040,699 | 8/1977 | Rasmussen | 339/91 R |
| 4,088,384 | 5/1978 | Gumb | 339/156 R |
| 4,118,757 | 10/1978 | Rinaldo | 361/421 |
| 4,186,988 | 2/1980 | Kobler | 339/176 MP |
| 4,193,654 | 3/1980 | Hughes et al. | 339/17 LC |
| 4,221,458 | 9/1980 | Hughes et al. | 339/126 R |
| 4,225,209 | 9/1980 | Hughes | 339/126 R |
| 4,231,628 | 11/1980 | Hughes et al. | 339/17 LC |

FOREIGN PATENT DOCUMENTS

| | | | |
|---|---|---|---|
| 1515850 | 1/1970 | Fed. Rep. of Germany | 339/17 D |

*Primary Examiner*—Neil Abrams

[57] ABSTRACT

Electrical connector receptacle of the type used in the telecommunications industry comprises a one-piece molded housing having a plug-receiving end and a plug-receiving opening extending into the plug-receiving end. A plurality of side-by-side conductors mounted in the housing have contact spring portions which extend from an internal sidewall of the plug-receiving opening adjacent to the plug-receiving end. These conductors extend over an external sidewall to the rearward end of the housing and across the rearward end past the other external sidewall, the ends of the conductors being intended to be inserted into holes in a circuit board and soldered to circuit board conductors. The housing has a frame portion which extends completely around the plug-receiving opening and has means at the rearward end for preventing insertion of a human finger into the plug-receiving end in a manner which could cause injury. A backwall is provided at the rearward end which prevents possible short circuiting of the conductors in the housing.

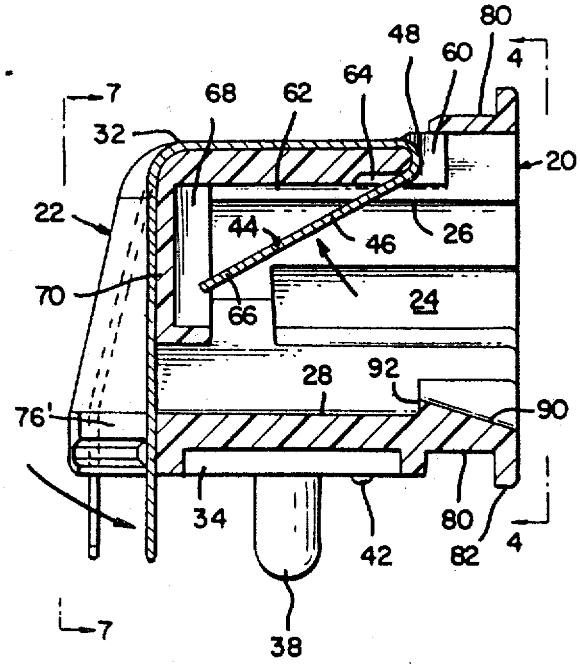

REEXAMINATION CERTIFICATE ISSUED UNDER 35 U.S.C. 307.

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 4, 6, 8, and 9 are determined to be patentable as amended:

Claims 2, 3, 5, 7, and 10, dependent on amended claims, are determined to be patentable.

1. An electrical connector receptacle of the type comprising an insulating housing having a plug-receiving end and a rearward end, a plug-receiving opening extending into said plug-receiving end, said opening having opposed internal sidewalls and opposed internal endwalls, said housing having oppositely directed external sidewalls and oppositely directed external endwalls, a plurality of electrical conductors in side-by-side spaced-apart relationship, each of said conductors comprising a contact spring *portion* extending from one of said internal sidewalls at a location adjacent to said plug-receiving end diagonally into said opening and towards the opposite internal sidewall, and each conductor having a lead portion extending from said plug-receiving end *transversely* through said housing [between] *from* said one internal sidewall [and] *to the exterior of* the adjacent external sidewall and *along said adjacent external sidewall* towards said rearward end, said plug-receiving opening being dimensioned to receive a connector plug having spaced-apart contact members therein which engage said contact spring portions of said conductors, said connector receptacle being characterized in that:

said plug-receiving end has a circumferentially continuous frame portion which surrounds *said* plug-receiving opening, conductor-receiving aperture means [extending] *extends* through said adjacent *external* sidewall to said one internal sidewall, said conductor-receiving aperture means being spaced from said plug-receiving end and adjacent to said frame portion, said conductor-receiving aperture means communicating with said plug-receiving opening, said conductors [extending] *extend* through said conductor-receiving aperture means, said contact springs extending into said plug-receiving opening from said conductor-receiving aperture means, *and* a plurality of side-by-side channels in said adjacent external sidewall [extending] *extend* from said conductor-receiving aperture means to said rearward end, said lead portions of said conductors *also* extending across said adjacent external sidewall and being in said channels, said conductors extending from said adjacent external sidewall across said rearward end and having end portions which extend beyond the other one of said external sidewalls, every other one of said conductors extending substantially normally from said adjacent external sidewall across said rearward end, the remaining conductors extending obliquely away from said adjacent external sidewall and across said rearward end whereby said end portions of said conductors are offset from each other.

4. An electrical connector receptacle as set forth in claim 1 having a plurality of spaced-apart *vertical* barrier walls *disposed along the interior of said rearward end and* extending from said one internal sidewall at a location adjacent to said rearward end towards said opposite internal sidewall, said contact springs having free end portions *unrestrained vertically by said barrier walls,* the free end portion of each contact spring being between an adjacent pair of said barrier walls.

6. A molded one-piece electrical receptacle of the type comprising an insulating housing having a plug-receiving end and a rearward end, a plug-receiving opening extending into said plug-receiving end, said opening having opposed internal sidewalls and opposed internal endwalls, said housing having oppositely directed external sidewalls and oppositely directed external endwalls, a plurality of electrical conductors in side-by-side spaced apart relationship, each of said conductors comprising a contact spring extending from one of said internal sidewalls at a location adjacent to said plug-receiving end diagonally into said opening and towards the opposite internal sidewall, and each conductor having a lead portion extending from said plug-receiving end *transversely* through said housing [between] *from* said one internal sidewall [and] *to the exterior of* the adjacent external sidewall and *along said adjacent external sidewall* towards said rearward end, said plug-receiving opening being dimensioned to receive a connector plug having spaced-apart contact members therein which engage said contact spring portions of said conductors, said connector receptacle being characterized in that:

said plug-receiving end has a circumferentially continuous frame portion which surrounds said plug-receiving opening, a plurality of side-by-side conductor-receiving apertures [extending] *extend* through said adjacent external sidewall to said one internal sidewall, said apertures *communicating with said plug-receiving opening and* being spaced from said plug-receiving end, and *also* being adjacent to said frame portion, said conductors [extending] *extend* through said conductor-receiving apertures, said contact springs extending into said plug-receiving opening from said conductor-receiving apertures, *and* a plurality of side-by-side channels in said adjacent external sidewall [extending] *extend* from said conductor-receiving apertures to said rearward end, and a like plurality of side-by-side channels in said rearward end [extending] *extend* from said adjacent external sidewall towards the other one of said external sidewalls, said lead portions of said conductors being disposed in said channels in said adjacent external sidewall and in said channels in said rearward end, said conductors having end portions which extend beyond the other one of said external sidewalls, every other one of said conductors having a substantially 90 degree bend at said rearward end and extending across said rearward end normally with respect to said adjacent external sidewall, and the remaining conductors being bent through an angle of less than 90° at said rearward end and extending across said rearward end obliquely with respect to said adjacent external sidewall whereby said end portions of alternate conductors are offset from the remaining conductors.

8. An electrical connector receptacle as set forth in claim 7, having a plurality of spaced-apart *vertical* barrier walls *disposed along the interior of said rearward end*

*and* extending from said one internal sidewall at a location adjacent to said rearward end towards said opposite internal sidewall, said contact springs having free end portions *unrestrained vertically by said barrier walls,* which are between adjacent pairs of said barrier walls.

9. An electrical connector housing as set forth in claim 8, said receptacle having a backwall at said rearward end extending from said one internal sidewall towards said opposite internal sidewall, said *vertical* barrier walls being integral with said backwall.

* * * * *